(12) United States Patent  
Yu

(10) Patent No.: US 8,548,404 B2
(45) Date of Patent: Oct. 1, 2013

(54) LINEARIZATION OF POWER AMPLIFIERS THROUGH DIGITAL IN-BAND PREDISTORTION FOLLOWED BY ANALOG PREDISTORTION

(75) Inventor: Qian Yu, Santa Clara, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 0 days.

(21) Appl. No.: 13/250,635

(22) Filed: Sep. 30, 2011

(65) Prior Publication Data

US 2013/0082773 A1    Apr. 4, 2013

(51) Int. Cl.
*H03C 1/62*    (2006.01)

(52) U.S. Cl.
USPC .............. 455/115.1; 455/114.3; 375/297

(58) Field of Classification Search
USPC ............ 455/114.2, 114.3, 115.1; 375/296, 375/297; 330/149
See application file for complete search history.

(56) References Cited

U.S. PATENT DOCUMENTS

| 5,732,333 | A  | * | 3/1998 | Cox et al. ..................... 455/126 |
| 5,745,006 | A  | * | 4/1998 | Budnik et al. ................ 330/149 |
| 5,898,338 | A  | * | 4/1999 | Proctor et al. ................ 330/149 |
| 6,885,241 | B2 | * | 4/2005 | Huang et al. .................. 330/149 |
| 6,947,711 | B1 | * | 9/2005 | Leyonhjelm ............... 455/114.3 |
| 6,985,099 | B1 | * | 1/2006 | Luz et al. ..................... 341/139 |

* cited by examiner

*Primary Examiner* — Sonny Trinh
(74) *Attorney, Agent, or Firm* — Edward C. Kwok; Hogan Lovells US LLP

(57) ABSTRACT

A system for implementing linearization of a radio frequency (RF) power amplifier (PA) in a base station, as well as various component circuitry for implementing said system. By means of a smart partitioning of the signal processing for predistortion between the analog domain and the digital domain, a more linear relationship between the digital input data and the output RF signal is achieved. Linearization of the PA's output signal is obtained using a mixed-signal apparatus. The digital baseband signal enters the RF signal source. The RF signal source comprises an in-band predistortion circuit, a microcontroller and digital modulator. The output of the digital modulator is an RF signal that enters the PA module. The PA module is composed of the PA and the RF power amplifier linearizer (RFPAL). The RFPAL comprises an RF predistortion circuit, and RF signal analyzer and a microcontroller.

20 Claims, 4 Drawing Sheets

(RELEVANT ART)

(RELEVANT ART)

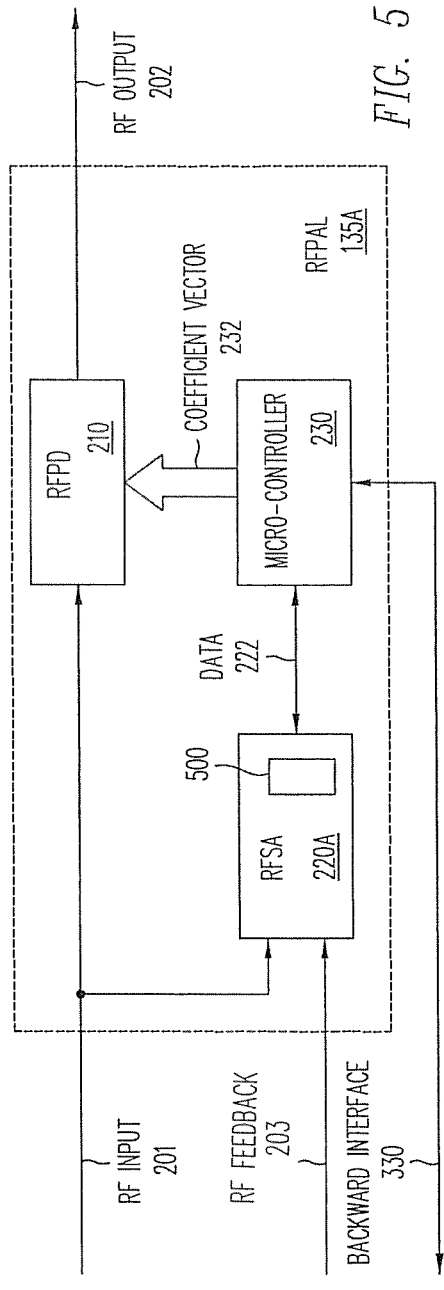
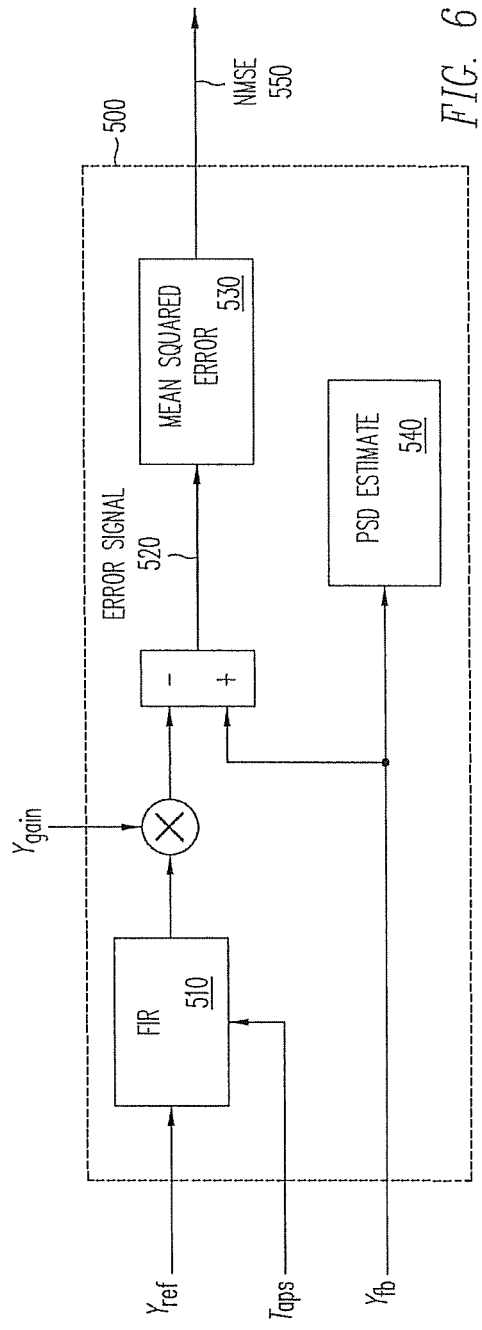

LINEARIZATION OF POWER AMPLIFIERS THROUGH DIGITAL IN-BAND PREDISTORTION FOLLOWED BY ANALOG PREDISTORTION

FIELD OF THE INVENTION

This invention relates to power amplification. In particular, this invention relates to linearization of a radio frequency (RF) power amplifier, as well as various component circuitry for implementing said system

BACKGROUND OF THE INVENTION

A telecommunication system consists of various geographically separated nodes exchanging signals. For example, a cellular telephone system includes towers each housing a base station that transmits and receives RF signals to and from cellular telephone transceivers within the service area of the base station. Signals transmitted over a radio link are attenuated due to distance and such factors as propagation loss and multipath fading. Since the strength of the signal is attenuated during transmission between nodes, signals typically transmitted with significant power, using circuit elements known as power amplifiers (PAs).

Cellular telephone systems employing 2.5G and 3G use sophisticated, non-constant envelop modulation techniques. Examples of such modulation techniques are wide-band code division multiple access (WCDMA), orthogonal frequency division multiplexing (OFDM), multicarrier Global System for Mobile Communications (GSM), and Enhanced Data Rates for GSM Evolution (EDGE). Since the data is encoded under these modulation schemes by amplitude and phase, to achieve highest signal integrity, the output signal of a base station transmitter must be highly linear over a wide dynamic range. The linearity of the PAs is even more important as the cellular phone systems encode higher data rates as more sophisticated systems (e.g., 4G systems) are deployed. Therefore, an ideal PA is expected to pass an input signal through to the output undistorted, with a user-tunable gain and a negligible or minimum delay, and independent of the output impedance of the input signal source.

A real PA, however, is not ideal over its entire operating range. The deviation from linear input-output relationship in a real PA may result in unwanted amplitude variations of the output signal and which interferes with signals in other radio channels (e.g., by injecting signals of unwanted harmonics at adjacent radio frequency ranges). A cellular wireless communication system, for example, has a need for a highly linear PA to provide an output signal that achieves a high adjacent channel leakage ratio (ACLR) and a low error vector magnitude (EVM).

To suppress unwanted PA nonlinearity, a predistortion circuit is provided to model the PA's gain and phase characteristics. The predistion circuit provides a pre-distortion signal, which is then combined with the PA's input signal at the input of the PA. Correctly modeled, the output signal of the PA from the combined signal is that of an overall system that is more linear, as compared to the same system without the contribution of the predistortion signal. Thus, purposely introduced predistortion into the input signal of the PA corrects nonlinearity in the output signal of the PA. One example of such a system is provided in U.S. Pat. No. 7,844,014 entitled "Pre-Distortion Apparatus" that issued on Nov. 30, 2010, incorporated herein by reference.

FIG. 1 is a functional block diagram for system 100, which is a linearized mixed-signal power amplifier in a base station. As shown in FIG. 1, RF signal source 110 includes digital modulator 105 for modulating baseband data 100 onto a carrier signal (not shown) provided by local oscillator (LO) 108. Digital modulator 105 may be, for example, a digital-to-RF quadrature modulator. The RF signal from digital modulator 105 is transmitted from RF signal source 110 over forward RF path 120 to PA module 130A using suitable means (e.g., over a coaxial cable). Many applications require separating RF signal source 110 from PA module 130. PA module 130 may include RF power amplifier linearizer (RFPAL) 135, which is coupled to RF path 120 via RF couplers 131 and 132. RFPAL 135 performs adaptive analog predistortion of the RF signal on RF path 120, prior to amplification by PA 138. The output signal of PA 138 is fed back using RF coupler 133 to RFPAL 135 to provide adaptive control.

FIG. 2 is a functional block diagram of RFPAL 135. RFPAL 135 has three subsystems, as follows: an RF predistortion block (RFPD) 210, an RF signal analyzer (RFSA) 220 and a micro-controller 230. RFPD 210 may be implemented, for example, by a RFPD disclosed in co-pending U.S. patent application Ser. No. 12/939,067 entitled "Analog Signal Processor for Nonlinear Predistortion of Radio-Frequency Signals" that names as inventor Qian Yu and others and was filed on Nov. 3, 2010, incorporated herein by reference. Similarly, RFSA 220 may be implemented, for example, by an RFSA disclosed in co-pending U.S. patent application Ser. No. 12/340,032 entitled "Integrated Signal Analyzer for Adaptive Control of Mixed-Signal Integrated Circuits" that names as inventor Qian Yu and others and was filed on Dec. 19, 2008, incorporated herein by reference.

RFSA 220 derives from signals RF input 201 and RF feedback 203 a complex-valued error signal that represents the waveform distortion. In addition, RFSA 220 also provides a real-time estimate of the power spectral density (PSD) of the error signal. The PSD and the complex-valued error signal are provided as data signal 222 to micro-controller 230, which provides coefficient vector 232 to RFPD 210. Coefficient vector 232 allows RFPD 210 to perform adaptive nonlinear analog signal processing on RF input signal 201. Because of the limitations inherent in analog circuits, however, it is difficult to realize all the desired improvements by way of signal processing techniques using only analog circuits. What is needed is a system that provides improved linearization of power amplifier in a base station without losing the advantages of the analog signal processing performed by RFPAL 135.

SUMMARY OF THE INVENTION

According to one embodiment of the present invention, a method partitions signal processing between the analog domain and the digital domain to improve predistortion performance over prior art.

According to one embodiment of the present invention, a mixed-signal RF power amplification system includes (a) an RF signal source for processing baseband digital data, the RF signal source including (i) an in-band digital predistortion circuit and (ii) a digital-to-RF modulator for modulating the baseband digital data; (b) an RF power amplifier module for amplifying the modulated baseband digital data and producing an RF output signal, the RF power amplifier module including (i) an RF power amplifier and (ii) an RF power amplifier linearizer with an RF predistortion circuit; (c) a signal path for transmitting the modulated data from the RF signal source to the RF power amplifier module; and (d) a data path providing an interface between the RF signal source and the RF power amplifier module.

In one implementation, the in-band digital predistortion circuit further includes a clipper for limiting the amplitude of the baseband digital data, a first finite impulse response filter for suppressing out-of-band harmonics, and a second finite impulse response filter to compensate for non-flat frequency response of the power amplifier. Furthermore, the in-band digital predistortion circuit may further include a normalized mean squared error (NMSE) computation (NMSE1) of the error between of the base band digital data and an output of the first finite impulse response filter for a measure of crest factor.

In one embodiment, the RF power amplifier linearizer further includes an RF signal analyzer, which includes a finite impulse response filter for compensating for a delay and a gain tilt of the modulated signal. For example, this finite impulse response filter may have 8 taps controlled by 8 complex-valued coefficients. The RF signal analyzer may also further compute a second NMSE (NMSE2) for measuring the error between output value of the finite impulse response filter and a feed-back value from the RF output signal. The RF signal source may further compute a third NMSE (NMSE3) for measuring the modulation error of the digital-to-RF modulator. The modulation error may be caused, for example, by an imbalance between an in-phase channel and a quadrature channel.

According to another embodiment of the present invention, a mixed-signal RF power amplification system for splitting predistortion between the digital and analog domains include (a) an RF signal module for processing baseband digital data by in-band predistortion in the digital domain and modulating the baseband digital data to a carrier frequency; and (b) an RF power amplifier module for amplifying the modulated digital data with an RF power amplifier and for processing by predistortion in the analog domain, wherein the predistortion by the RF signal module and the RF power amplifier module linearize the output signal of the RF amplifier. The RF signal module may include a polar clipper for modifying the cumulative distribution function of the output signal of the power amplifier, a micro-controller for computing an error vector magnitude (EVM) and varying a threshold value for the polar clipper to achieve a predetermined EVM.

The present invention is better understood upon consideration of the detailed description below and the accompanying drawings.

BRIEF DESCRIPTION OF THE FIGURES

FIG. 5 is a block diagram of an example embodiment of an RF PA linearizer.

FIG. 6 is block diagram of an example embodiment of subsystem in the RF PA linearizer described in FIG. 5.

DETAILED DESCRIPTION

Figure 3:
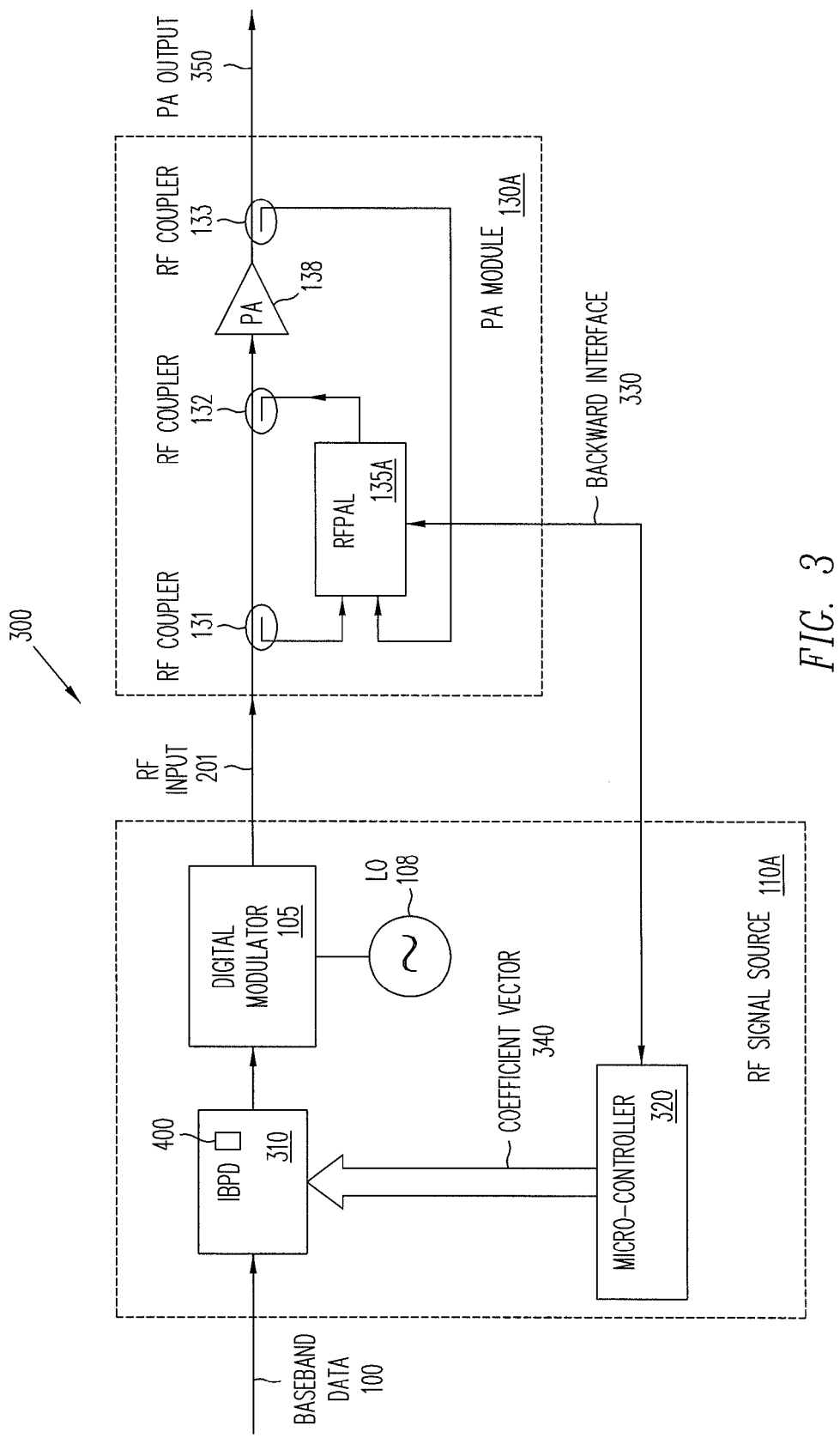
FIG. 3 is a block diagram illustrating linearization of a PA in a base station, in accordance with one embodiment of the present invention.

FIG. 3 is a functional block diagram of system 300 which illustrates linearization of a mixed-signal power amplifier in a base station, in accordance with one embodiment of the present invention As system 100 shown in FIG. 3, RF signal source 110A includes in-band predistortion (IBPD) block 310, micro-controller 320 and digital modulator 105. In addition, backward data interface 330 is provided to connect IBPD block 310 with RFPAL 135A.

Figure 1:
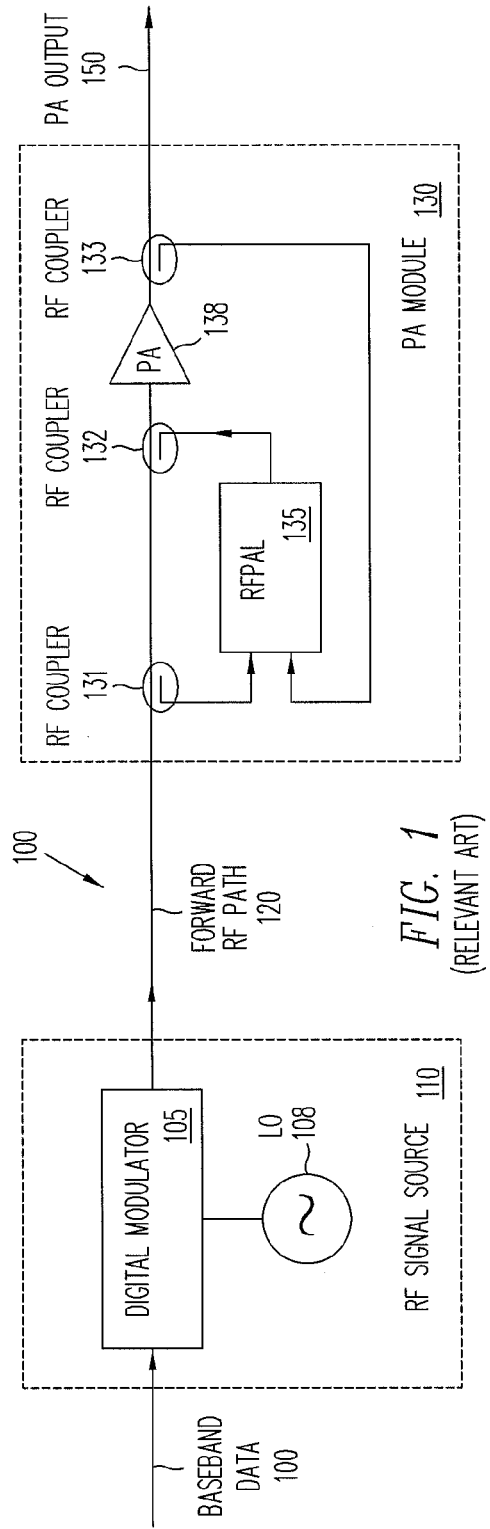
FIG. 1 is a block diagram showing relevant art regarding linearization of a PA in a base station.
Figure 2:
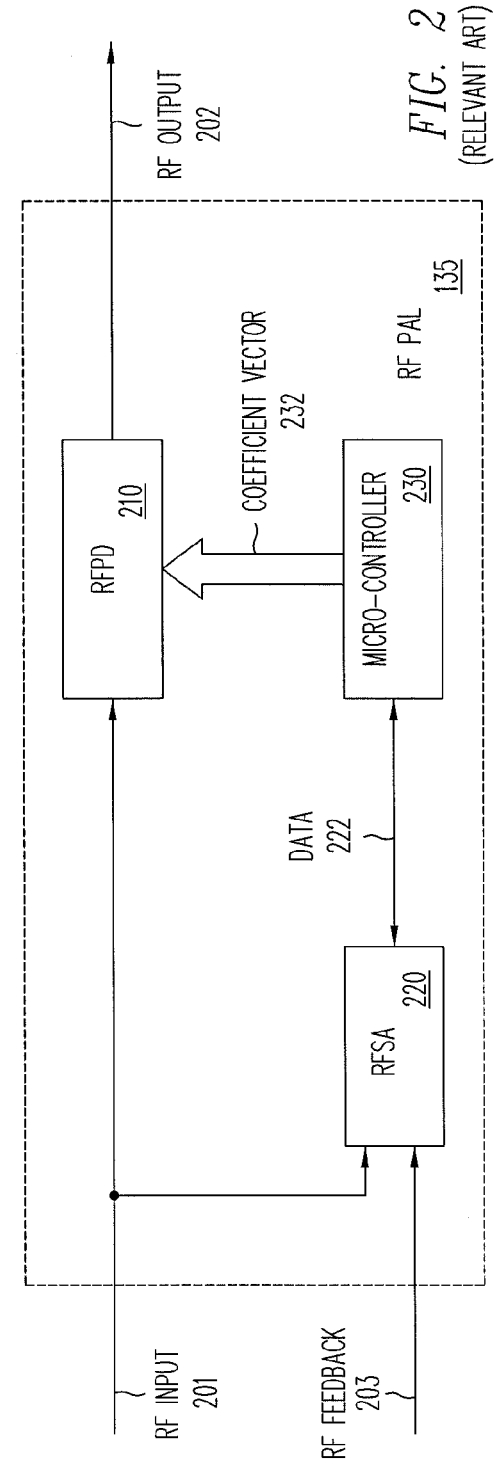
FIG. 2 is a block diagram showing relevant art regarding an RF PA linearizer, such as that introduced in FIG. 1.

Backward data interface 330 can be either wired or wireless. For example, if the RF signal source and the PA module are connected by a coaxial cable, then backward data interface 330 may use a low frequency band of the connecting coaxial cable. In one embodiment, backward data interface 330 is a low-speed, bi-directional communication interface for exchanging data between the PA module 130A and RF signal source 110A. Backward data interface 330 provides data to micro-controller 320, which processes the data to provide coefficient vector 340 to IBPD 310. The output signal of IBPD block 310 in system 300 is provided to digital modulator 105, which may be implemented, for example, by digital modulator 105 of FIG. 1.

IBPD block 310 improves signal quality in several ways. First, IBPD block 310 performs predistortion in the digital domain on only the in-band signals without creating any significant out-of-band spectral emissions. Linear filtering is one method for in-band predistortion that may be used to compensate the frequency response of a power amplifier in multi-carrier, wideband signal applications. IBPD block 310 may modify the complementary cumulative distribution function (CCDF) of the signal, as needed.

The quality of PA output 350 may be characterized by two parameters: the out-of-band emission level, such as, the adjacent channel leakage ratio (ACLR) and the error-vector magnitude (EVM). ACLR is the ratio of the transmitted power to the power measured in the adjacent channels. EVM measures the difference between the measured waveform and the theoretical modulated waveform. In general, it is much more difficult to meet the requirement on ACLR than for EVM.

Many commercial wireless modulation systems suffer from high peak-to-average ratios, also known as crest factor (CF). Some important examples of modulation schemes with large CF are WCDMA, OFDM, GSM and EDGE. In the prior art, predistortion methods include crest factor reduction (CFR) that reduce the peak-to-average ratio of the modulated signal. In the prior art, CFR and digital predistortion block operate independently. CFR in the prior art trades off the EVM in a controlled manner for significant improvement in ACLR. However, the inventor of the present invention has discovered that, for many RF power amplifiers, the ACLR performance is more correlated to the shape of the CCDF than to the CF. Prior art CFR algorithms, therefore, often lead to sub-optimal ACRL performance.

In one embodiment, IBPD block 310 may modify the shape of the CCDF to reduce CF and to improve both ACLR and EVM. In addition, further improvements to PA output 150 may be achieved by predistortion in both digital and analog domains in IBPD 310 and RFPAL 135A, respectively. The result is the joint adaptation of RF signal source 110A and PA module 130A connected via backward interface 330. In one embodiment, ACLR is minimized under a constrained EVM (e.g., EVM is constrained to less than or equal to a maximum value). This detailed description illustrates the present invention using an implementation with this constraint while not being limited by the constraint.

Figure 4:
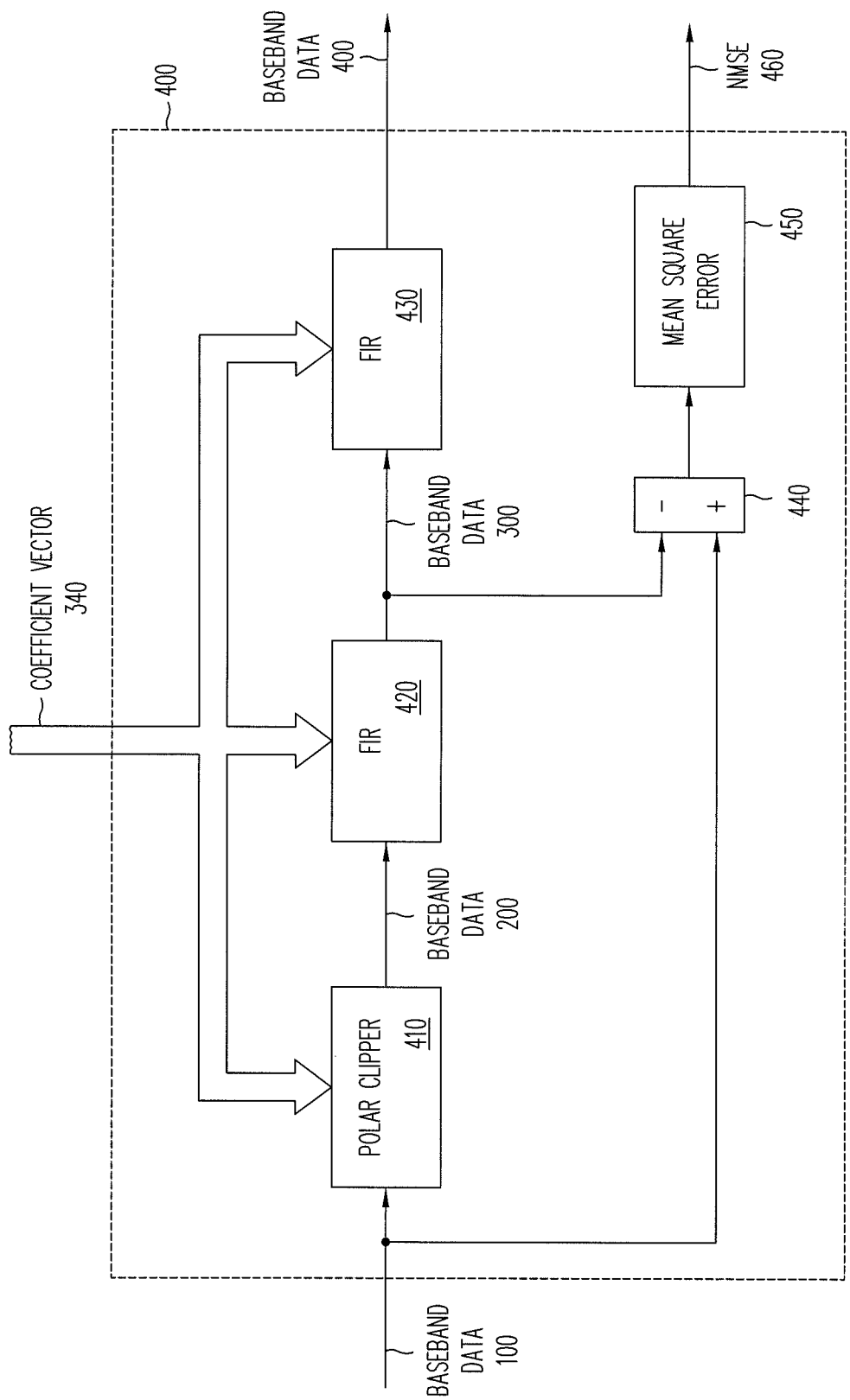
FIG. 4 is block diagram of an example embodiment of a subsystem in the in-band predistortion block described in FIG. 3.

According to one embodiment of the present invention, FIG. 4 shows first subsystem 400 in IBPD block 310. Subsystem 400 implements the digital portion which shapes CCDF using a clipper threshold $r_{th}$ as a control variable. As shown in FIG. 4. baseband data signal 100 is received into polar clipper 410, which processes baseband data signal 100.

The clipped signal (i.e., baseband data signal 200) is successively processed in finite impulse response (FIR) filters 420 and 430. Assume complex baseband signal $r(t)e^{j\Phi(t)}$ is received at polar clipper 410, which output signal is $g[r(t)]e^{j\Phi(t)}$, where $g(r)$ is a limiter function with a clipper threshold of $r_{th}$, limiter function $g(r)$ being given by Equ. 1(a) and 1(b):

$$g(r)=r(t)e^{j\Phi(t)} \text{ for } |r(t)|<r_{th} \quad \text{Equ. 1(a)}$$

and $$g(r)=|r_{th}|e^{j\Phi(t)} \text{ for } |r(t)|\geq r_{th} \quad \text{Equ. 1(b).}$$

The threshold, $r_{th}$ is taken from coefficient vector 340, which is provided by microcontroller 320.

FIR 420 may be a 128-tap filter designed for suppressing the out-of-band spectral re-growth due to clipping by polar clipper 410. FIR 420 is implemented using a fast fourier transform (FFT) and overlap-add technique that is well-known to those of ordinary skill in the art. Ideally, the frequency response is unity at in-band frequencies and zero at the out-of-band frequencies. Transitions at band edges may be implemented by raised-cosine roll-off. As shown in FIG. 4, the output of FIR 420 is referred to as baseband data signal 300. In one implementation, the filter coefficients for FIR 420 are provided in coefficient vector 340 by microcontroller 320.

FIR 430 may be a 3-tap filter designed for compensating the non-flat frequency response across the signal bandwidth of PA 138. The first-order effect of a non-flat frequency response is exhibited in the time domain a gain tilt and phase tilt (i.e., a group delay). In one embodiment, only the gain tilt is compensated in IBPD block 310, while the second-order and higher-order effects of baseband data signal 200 are ignored. To compensate gain tilt, the impulse response of FIR 430 is a 3-tap FIR having coefficients [−ja, 1, ja], where a is a real coefficient proportional to the gain tilt (which is also the inverse of the gain tilt of FIR 510, to be described below in conjunction with FIG. 5). The output signal of FIR 430 is shown in FIG. 4 as baseband data signal 400. As in FIR 420, the filter coefficients of FIR 430 are taken from coefficient vector 340, which is provided by microcontroller 320.

The IBPD block 310 may also provide a normalized mean square error (NMSE) calculated by NMSE 460 arising from the CF, as shown in FIG. 4. NMSE 460 is measured in real-time by comparing baseband data signal 300 with baseband data signal 100, using difference block 440 and mean square error block 450. When the clipper threshold, $r_{th}$, is less than the peak envelope, max $[r(t)]$, NMSE 460 is non-zero and increases monotonically with (max $[r(t)]-r_{th}$).

FIG. 5 is a functional block diagram showing one embodiment of an RFPAL 135A. in accordance with one embodiment of the present invention. As shown in FIG. 5, RFSA 200A includes subsystem 500 which provides a real-time measure of the NMSE of the PA which is further described in reference to FIG. 6. Backward data interface 330, described in reference to FIG. 3, connects IBPD block 310 with micro-controller 230.

RFPD 210 uses a perturbation-based optimization algorithm to minimize the out-of-band emissions in RF Feedback signal 203. RFPD 210 can compensate for the nonlinearities in both RF input signal 201 and PA output signal 350. Because RFPD 210 compensates the nonlinearities in the RF signal, the specifications of nonlinearity-related parameters of digital modulator 105 can be relaxed, thus allowing a chip implementation where RF signal source 110A is integrated on a single complementary metal-oxide-semiconductor (CMOS) circuit.

FIG. 6 shows subsystem 500 of RFSA 220A, in accordance with one embodiment of the present invention. Subsystem 500 in RFSA 220A uses at least the following parameters to calculate NMSE 550: (1) $y_{ref}$, a sampled, digitized representation of RF input signal 201; (2) $y_{fb}$, a sampled, digitized representation of RF feedback signal 203; and (3) $y_{gain}$, a sampled, digitized representation of the complex envelope of RF feedback signal 203, that is obtained from a quadrature down-conversion, followed by analog-to-digital conversion by digital modulator 105. FIR 510 is an 8-tap filter with complex-valued, software programmable coefficients. The firmware in RFSA 220A optimizes the coefficients sent to FIR 510 by minimizing NMSE 550, based on the control variables delay and gain tilt. NMSE 550 is a real-time measure of the NMSE of the PA. In one embodiment, FIR 510 is illustrated herein only using the delay and gain tilt control variables. However, additional control variables can be introduced, so that the FIR can generate high-order effects (e.g. group-delay dispersion) for a wide band signal. In general, FIR 510 replicates the linear memory or linear filtering effect of the PA, so that error signal 520 represents the residual nonlinear distortion of the PA.

In addition, RFSA 220A provides a real-time PSD estimate 540. Because PSD estimate 540 is approximately zero at out-of-band frequencies, RFPAL 135a can automatically identify the in-band and out-of-band frequency ranges. Alternatively, frequency-range information may be provided by a base station to RFPAL 135, thus greatly reduces the complexity of the control firmware in RFPAL 135a. IBPD block 310 uses the frequency-range data to determine the frequency response of FIR 420 using filter coefficients taken from coefficient vector 340. Information regarding the PA-induced distortion—in-band frequency ranges, gain tilt and NMSE 550—are sent by RFSA 220A to IBPD 310 via data signal 222, micro-controller 230 and backward interface 330.

The real-time optimization of overall EVM is performed by micro-controller 320 in RF signal source 110A. The threshold $r_{th}$ mentioned above with respect to Equ. 1(a) and 1(b) for polar clipper 410 is now described in further detail. The EVM is estimated according to Equ. 2:

$$EVM=\sqrt{NMSE460+NMSE550+NMSE660} \quad \text{Equ. 2}$$

NMSE 460 is already described above with respect to FIG. 4. NMSE 550 is described in reference to FIG. 5. NMSE 660 is the real-time modulation error of digital modulator 105 and typically arises from I-channel and Q-channel imbalance. Instead of measuring NMSE 660 in real-time, a conservative estimate, $\epsilon$, of NMSE 660 can be made, and EVM can be computed according to Equ. 3:

$$EVM=\sqrt{NMSE460+NMSE550+\epsilon} \quad \text{Equ. 3}$$

When the clipper threshold, $r_{th}$, is set, coefficients vector 232 for RFPD 210 is adapted to minimize out-of-band emissions. The corresponding result of the out-of-band emission that is measured by EVM as a function of $r_{th}$ is designated as $F(r_{th})$, where $F(r_{th})$ is typically a monotonically increasing function. The corresponding EVM estimated from Equ. 3 is denoted by $E(r_{th})$ where $E(r_{th})$ is a monotonically decreasing function. $F(r_{th})$ is often referred to as a cost function and is used for adaptive control of the RFPD. In one example embodiment, the cost function may be the out-of-band emission of the PSD. In that embodiment, the cost function is completely insensitive to the linear memory effect of the PA. In certain applications, it is difficult to extract the out-of-band emission, and the cost function, $F(r_{th})$, can be selected as NMSE 550. In order to use NMSE 550 as a measure of nonlinear distortion, FIR 510 may be controlled in such a manner as to allow it to replicate the linear memory effect of the PA.

In one example embodiment, RF signal source 110A can implement firmware that uses a perturbation-based algorithm according to Equ. 4, where $E_0$ is the maximum allowed value of EVM:

$$\text{Min}[F(r_{th})] \text{ for } E(r_{th}) \geq E_0 \qquad \text{Equ. 4}$$

Assuming the monotonic behavior of both $F(r_{th})$ and $E(r_{th})$, the clipper threshold, $r_{th}$ is varied, as needed, to make it greater or lesser to satisfy the requirement of Equ. 4. Microcontroller 320 is programmed to meet a preferred EVM by approaching $E_0$ without exceeding this value and remain fixed, if $r_{th}$ is not saturated at either end of its range.

In the embodiments disclosed herein, only one control variable, the clipper threshold, $r_{th}$ is shown, which provides significant performance improvements. However, other control variables are also possible to achieve optimum shaping of the CCDF.

The above detailed description is provided to illustrate the specific embodiments of the present invention and is not intended to be limiting. Various modifications and variations within the scope of the present invention are possible. The present invention is set forth in the claims.

What is claimed is:

1. A mixed-signal RF power amplification system comprising:
   an RF signal source for processing baseband digital data, the RF signal source comprising an in-band digital predistortion circuit and a digital-to-RF modulator for modulating the baseband digital data;
   an RF power amplifier module for amplifying the modulated baseband digital data and producing an RF output signal, the RF power amplifier module comprising an RF power amplifier and an RF power amplifier linearizer with an RF predistortion circuit;
   a signal path for transmitting the modulated data from the RF signal source to the RF power amplifier module; and
   a data path providing an interface for exchanging control data between the RF signal source and the RF power amplifier module to allow joint adaptation of the RF signal source and the RF power amplifier module.

2. The mixed-signal power amplification system of claim 1, wherein the signal path for transmitting the modulated data is propagated either by wire or wirelessly.

3. The mixed-signal power amplification system of claim 2, wherein the in-band digital predistortion circuit further comprises a clipper for limiting the amplitude of the baseband digital data.

4. The mixed-signal power amplification system of claim 3, wherein the in-band digital predistortion circuit further comprises a first finite impulse response filter for suppressing out-of-band harmonics.

5. The mixed signal power amplification system of claim 4, wherein the in-band digital predistortion circuit further comprises a second finite impulse response filter to compensate for non-flat frequency response of the power amplifier.

6. The mixed-signal power amplification system of claim 5, wherein the in-band digital predistortion circuit further comprises a first normalized mean squared error (NMSE) computation (NMSE1) of the error between of the baseband digital data and an output of the first finite impulse response filter for a measure of crest factor.

7. The mixed-signal power amplification system of claim 6, wherein the RF power amplifier linearizer further comprises an RF signal analyzer.

8. The mixed-signal power amplification system of claim 7, wherein the RF signal analyzer further comprises a finite impulse response filter for compensating for a delay and a gain tilt of the modulated data.

9. The mixed-signal power amplification system of claim 8, wherein the RF signal analyzer further comprises a second NMSE computation (NMSE2) for measuring the error between output of the finite impulse response filter and a feed-back from the RF output signal.

10. The mixed-signal power amplification system of claim 9, wherein the RF signal source further comprises a third NMSE computation (NMSE3) for measuring the modulation error of the digital-to-RF modulator.

11. The mixed-signal power amplification system of claim 10, wherein the RF signal source further comprises a microcontroller for computing an error vector magnitude (EMV) according to the following equation:

$$\text{EVM} = \sqrt{\text{NMSE1} + \text{NMSE2} + \text{NMSE3}} \qquad (1).$$

12. The mixed-signal power amplification system of claim 11, wherein NMSE3 is estimated using a value, $\epsilon$, such that EVM is computed by the micro-controller according to the following equation:

$$\text{EVM} = \sqrt{\text{NMSE1} + \text{NMSE2} + \epsilon} \qquad (2).$$

13. The mixed-signal power amplification system of claim 11, wherein the RF signal analyzer has a micro-controller connected by the data path to the micro-controller in the RF signal source.

14. The mixed-signal power amplification system of claim 13, wherein the polar clipper receives a complex baseband signal, $r(t)e^{j\phi(t)}$, and outputs a signal, $g[r(t)]e^{j\phi(t)}$, wherein $g(r)$ is a limiter function for a clipper threshold of $r_{th}$ according to the following equation:

$$g(r) = r(t)e^{j\phi(t)} \text{ for } |r(t)| < r_{th} \qquad (3)$$

$$g(r) = |r_{th}|e^{j\phi(t)} \text{ for } |r(t)| \geq r_{th} \qquad (4).$$

15. The mixed-signal power amplification system of claim 14, wherein a coefficient vector to the RF predistortion circuit is varied to minimize out-of-band emissions for a clipper threshold of $r_{th}$.

16. A mixed-signal RF power amplification system for splitting predistortion between the digital and analog domains comprising:
   an RF signal module for processing baseband digital data by in-band predistortion in the digital domain and modulating the baseband digital data to a carrier frequency; and
   an RF power amplifier module for amplifying the modulated digital data with an RF power amplifier and for processing by predistortion in the analog domain;
   wherein the predistortion by the RF signal module and the predistortion by the RF power amplifier module linearize the output signal of the RF amplifier, and wherein the RF signal module and the RF power amplifier exchange control data to achieve joint adaptation.

17. The mixed-signal RF power amplification system for splitting predistortion of claim 16 further comprising a signal path for transmitting the modulated digital data from the RF signal source to the RF power amplifier module.

18. The mixed-signal RF power amplification system for splitting predistortion of claim 17 further comprising a data path that is an interface between the RF signal source and the RF power amplifier module.

19. The mixed-signal RF power amplification system for splitting predistortion of claim 18 wherein the RF signal module further comprises a polar clipper for modifying the cumulative distribution function of the output signal of the power amplifier.

20. The mixed-signal RF power amplification system for splitting predistortion of claim 19 wherein the RF signal module further comprises a micro-controller for computing an error vector magnitude (EVM) and varying a threshold value for the polar clipper to achieve a predetermined EVM.

\* \* \* \* \*